INTEGRATED CIRCUIT UTILIZING DIELECTRIC PLUS
JUNCTION ISOLATION

Filed March 18, 1968

4 Sheets-Sheet 1

INVENTORS
JEAN-CLAUDE FROUIN
M. DE BREBISSON
[signature]
AGENT

March 10, 1970 JEAN-CLAUDE FROUIN ET AL 3,500,139

INTEGRATED CIRCUIT UTILIZING DIELECTRIC PLUS JUNCTION ISOLATION

Filed March 18, 1968 4 Sheets-Sheet 2

INVENTORS
JEAN-CLAUDE FROUIN
M. DE BREBISSON

AGENT

INVENTORS
JEAN-CLAUDE FROUIN
M. DE BREBISSON
Frank R. Trifari
AGENT

INVENTORS
JEAN-CLAUDE FROUIN
M. DE BREBISSON

AGENT

United States Patent Office 3,500,139

Patented Mar. 10, 1970

3,500,139
INTEGRATED CIRCUIT UTILIZING DIELECTRIC PLUS JUNCTION ISOLATION

Jean-Claude Frouin and Michel de Brebisson, Calvados, France, assignors, by mesne assignments, to U.S. Philips Corporation, New York, N.Y., a corporation of Delaware Filed Mar. 18, 1968, Ser. No. 713,662
Claims priority, application France, Mar. 16, 1967, 99,074
Int. Cl. H01l *11/00, 15/00, 5/00*
U.S. Cl. 317—235 6 Claims

ABSTRACT OF THE DISCLOSURE

An integrated circuit in which islands containing circuit elements are isolated from one another partly by a p-n junction between an epitaxial layer and a substrate, and partly by polycrystalline semiconductor filled grooves, offering the advantages of comparatively simple manufacture yet comparatively good isolation.

This invention relates to an integrated semiconductor device comprising a substrate covered with an epitaxial layer which forms an insulating p-n junction with the substrate, the epitaxial layer being divided into relatively insulated islands in which semiconductor circuit elements have been found.

The islands in the epitaxial layer are in general relatively insulated by diffused insulating regions of a conductivity type equal to that of the substrate and which extend throughout the thickness of the insulating layer. However, such insulation by local diffusion involves numerous drawbacks, especially with regard to the mutual insulation of the various islands. This insulation has disadvantages since undesirable effects, such as leakage currents and space charge capacities, may occur at the junction. The polarisation voltage applied to the substrate must be limited to prevent the breakdown voltage from being reached. Furthermore the diffusion for obtaining the insulating regions must be deep enough to reach the substrate and this usually requires a very long period of diffusion during which undesirable diffusion of impurities into or from an epitaxial layer may occur.

The impurity concentration or at least the surface concentration of a diffused insulating region is usually higher than the impurity concentration in the substrate and in the islands. Thus the breakdown voltage of the p-n junction between an island and an insulating region is lower than that of the p-n junction between an island and the substrate and this is often undesirable. Furthermore, the parasitic capacity between an island and the diffused insulating region is often unduly high as a result of the high impurity concentration in the insulating region.

The diffused insulating regions may be substituted by grooves. This results in an increased breakdown voltage, since this is now determined by the breakdown voltage of the p-n junction between an island and the substrate. Furthermore the parasitic capacities, for example, are decreased.

However, such grooves impede the formation of conductive connections between circuit elements provided in the islands. Furthermore the p-n junction between the islands and the substrate occur at the free surface areas of the walls of the grooves and this is undesirable.

An object of the invention is to obviate the above-mentioned disadvantages.

The invention underlies inter alia recognition of the fact that this is possible by filling the grooves with insulating material having a coefficient of expansion which is substantially equal to that of the islands. The invention also underlies the recognition that polycrystalline semiconductor material affords optimum possibilities.

According to the invention an integrated semiconductor device of the kind mentioned in the preamble is characterized in that the epitaxial layer on the substrate is divided into islands by grooves extending from the free surface of said layer and intersecting the insulating p-n junction between said layer and the substrate, that the grooves are filled with polycrystalline semiconductor material, and that the islands and the filled grooves are covered with an insulating layer provided with conductive tracks which are connected to the circuit elements through apertures in the insulating layer.

In a device according to the invention the possibilities afforded by the use of grooves and by the use of insulating regions are combined in a very favourable manner.

It will be evident that the polycrystalline semiconductor material preferably consists of a semiconductor identical with the substrate.

It should be noted that integrated semiconductor devices are known in which the islands are wholly embedded in insulating material. These devices exhibit excellent insulation between the islands but have a very high cost price.

Preferably the walls of the grooves are covered with an insulating layer, for example, of silicon oxide. The polycrystalline semiconductor material need not then satisfy particularly high requirements of insulation and serves only as a filler.

The advantages of a device according to the invention are obvious if this device is compared to known devices. The insulation of the islands has very good properties, the breakdown voltage is high and the capacity is low. These properties may be dependent upon the thickness and upon the resistivity of the insulating layer covering the walls of the groove and it is easy to choose an insulating material and give it a thickness which gives complete satisfaction in this respect.

An important embodiment is characterized in that the conductive tracks exhibit contact areas in the form of widenings and that at least these contact areas are entirely located above the filled grooves.

This latter fact affords several advantages. On the one hand broad grooves can be filled more easily than narrow grooves and, on the other hand, it is possible considerably to reduce the peripheral zone referred to as the "dead region," which is usually formed around each integrated circuit unit and above which the contacts for external connections are present. Furthermore, in numerous cases, a simpler pattern of conductors is possible.

In order that the invention may be readily carried into effect it will now be described in detail, by way of example, with reference to the accompanying diagrammatic drawings, in which.

Figure 3:
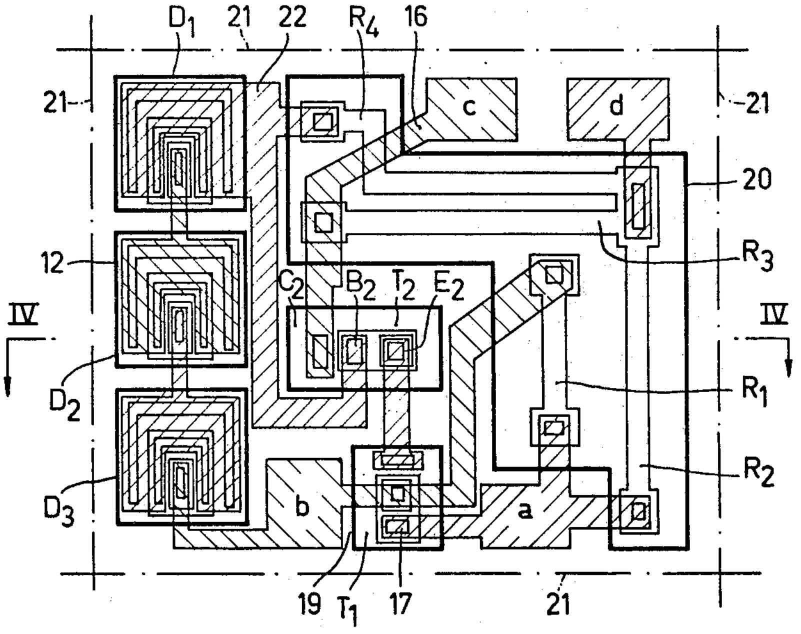
FIGURE 3 is a plan view on the circuit of FIGURE 2 in an integrated form according to the invention.

FIGURES 8*a* to 8*e* illustrate in sections taken on the line IV—IV of FIGURE 3, the various stages of manufacture of the integrated circuit of FIGURE 3.

Figure 1:
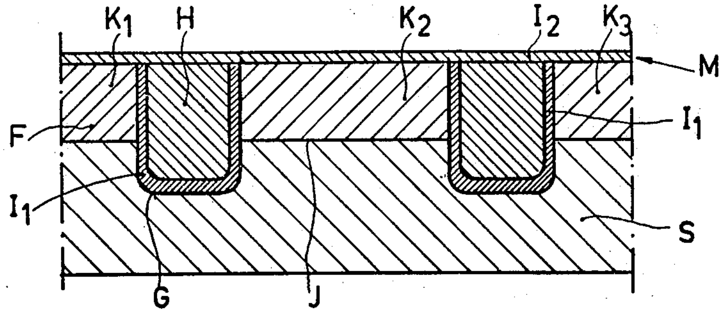
FIGURE 1 is a sectional view of part of a semiconductor device according to the invention.

The device of FIGURE 1 comprises a substrate S covered with an epitaxial layer F having a conductivity type which differs from that of the substrate, resulting in a p-n junction J. The device exhibits grooves G which extend into the substrate S. Several islands K1, K2, K3 are thus bounded by the said grooves. The inner surface of each groove is covered with an insulating layer $I_1$ and the grooves are filled with polycrystalline semiconductor material H, resulting again in a flat surface M, which is covered with an insulating layer $I_2$ of, for example, silicon oxide.

The islands K are relatively insulated by the junctions J and the filled grooves G, the kind and the thickness of which may readily be chosen so as to obtain excellent lateral insulation.

Two examples of integrated circuits will now be described which are intended to illustrate two particular embodiments of the invention and the method of manufacturing these circuits. The first example is a high-frequency broadband amplifier 5 and the second example is an integrated linear low-frequency circuit of high power which constitutes a voltage control.

Figure 2:
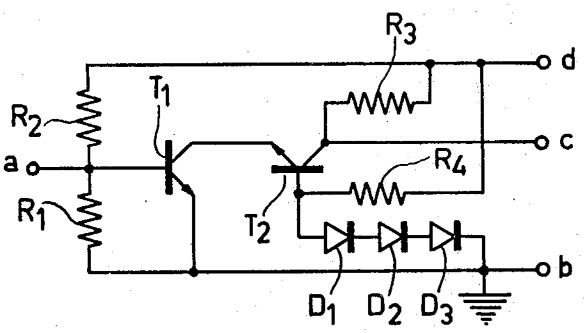
FIGURE 2 is a circuit diagram of a first example of a circuit to be integrated.

The amplifier, the diagram of which is shown in FIGURE 2, comprises two transistors T1 and T2 of the npn-type. The base of T1 is connected to an input terminal *a* and polarised by a resistance bridge R1, R2 arranged between a supply terminal *d* and an earth terminal *b*. The emitter and the collector of T1 are connected to earth and to the emitter of T2, respectively. The collector of T2 is connected on the one hand to the terminal *d* via a resistor R3 and on the other hand to an output terminal *c*, its base being connected on the one hand to terminal *d* via a resistor R4 and on the other hand to earth via a series-combination of diodes D1, D2 and D3.

Figure 4:
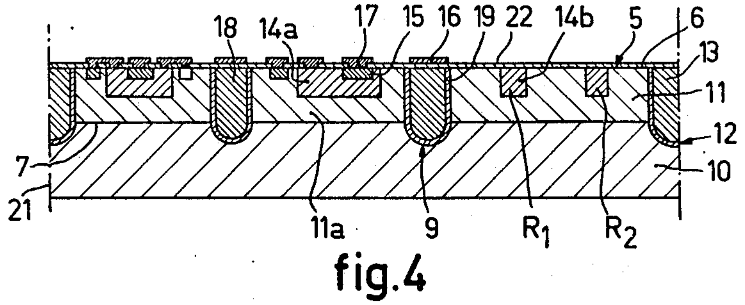
FIGURE 4 is a sectional view of the same integrated circuit, taken on the line IV—IV of FIGURE 3.

FIGURES 3 and 4 are a plan view and a sectional view, respectively, of the integrated circuit, dot-and-dash lines 21 indicating the area at which the circuit after completion can be cut from a larger plate.

The various elements of a circuit are distributed over six islands. Thick lines in FIGURE 3 indicate the boundaries of the islands: the three islands corresponding to the three diodes D1, D2, D3, respectively, the two islands corresponding to the transistors T1 and T2 respectively, and an island 20 which combines the four resistors R1, R2, R3 and R4. In this plan view the contact areas corresponding to the terminals *a*, *b*, *c* and *d* can be seen. These contact areas are widened parts of connecting tracks, for example 16, which have been deposited simultaneously with said areas, as well as the connecting tracks between the elements, for example 22, and the electrodes, for example 17. The contact areas and the tracks are shown cross-hatched in FIGURE 3 for the sake of clarity.

The cross-sectional view of FIGURE 4 shows a substrate 10 and an epitaxial layer 11 having a conductivity type which is opposite to that of the substrate, resulting in an insulating junction 7.

In the embodiment shown, the substrate 10 consists of p-type monocrystalline silicon and the epitaxial layer 11 is of n-type silicon. The islands are separated by grooves 9 each coated with an insulating layer 19 of silicon oxide and filled with polycrystalline silicon 18.

The regions 14 are regions of a conductivity type opposite to that of the layer 11 and are obtained by diffusion of a suitable impurity, the regions 15 being regions of low resistivity and of a conductivity type opposite to that of the regions 14 and being obtained by diffusion of a suitable impurity. In this example the regions 14 are p-type regions and contain boron as an impurity, the regions 15 being $n^+$-type regions and containing phosphorus as an impurity, the transistors T1 and T2 being of the npn-type. The transistor T2 has, for example, a p-type base B2 (region 14*a* of FIGURE 4), an n-type collector C2 and an n-type emitter E2 (regions 11*a* and 15 respectively of FIGURE 4).

The diodes D1, D2, D3 are in fact npn-transistors the collectors and bases of which are short-circuited and which are of a structure identical with that of T1 and T2. The resistors R1, R2, R3, R4 consist of diffused p-type strips (regions 14*b* of FIGURE 4).

The surface 5 is covered with an insulating layer 6 of, for example, silicon oxide, in which windows are formed for making electric connections to semiconductor regions.

It will be seen that the islands of the substrate 10 are insulated by a p-n junction 7 and relatively insulated by grooves 18, the layers 19 and 6 being silicon oxide layers.

The substrate 10 and the layer 11 have thicknesses of $160\mu$ and $10\mu$ respectively. The grooves 13 and 18 have a total depth of $15\mu$ so that they extend into the substrate 10, whilst the insulating layers 12 and 19 of silicon oxide are approximately $1\mu$ thick. The layer 6 may have a thickness of the same order of magnitude or thicker since it is, at least locally, the resultant of a series of oxidations, as will be explained hereinafter. The diffused regions 14 are, for example, $3\mu$ thick and the diffused regions 15 are, for example, $2\mu$ thick.

The metal tracks formed on the oxide layer 6 are vapour-deposited aluminium layers each approximately $0.8\mu$ thick.

Figure 5:
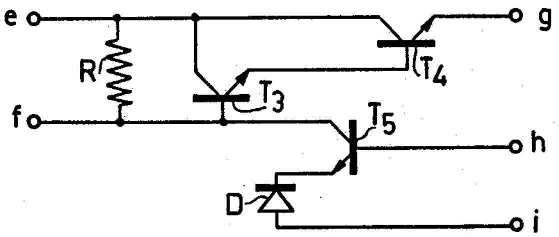
FIGURE 5 shows the circuit diagram of a second example of a circuit to be integrated.

The voltage control, the diagram of which is shown in FIGURE 5, comprises three transistors T3, T4 and T5 of the npn-type. The collector of transistor T3 is connected to an input terminal *e* and to the collector of transistor T4, the emitter of which is connected to an output terminal *g* carrying controlled voltage. The emitter of T3 is connected to the base of T4, while the base of T3 is connected on the one hand to a terminal *f* and on the other hand to the collector of T5. A resistor R is connected in parallel to the terminals *e* and *f*, whilst the base of T5 is connected to a terminal *h* carrying a difference voltage and the emitter of which is connected to an earthed terminal *i* via an oppositely-connected diode D.

Figure 6:
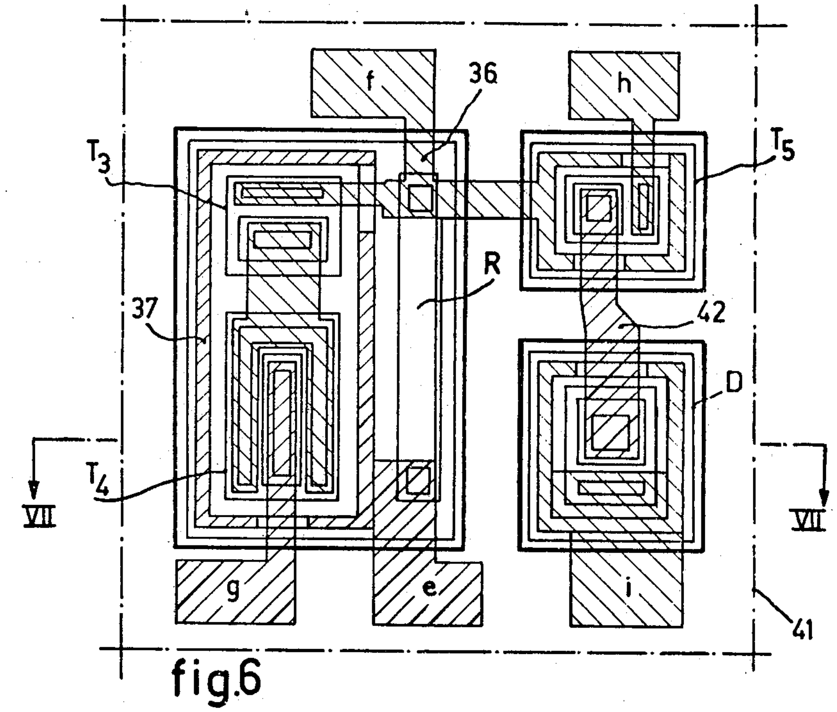
FIGURE 6 is a plan view on the circuit of FIGURE 5 in an integrated form according to the invention.
Figure 7:
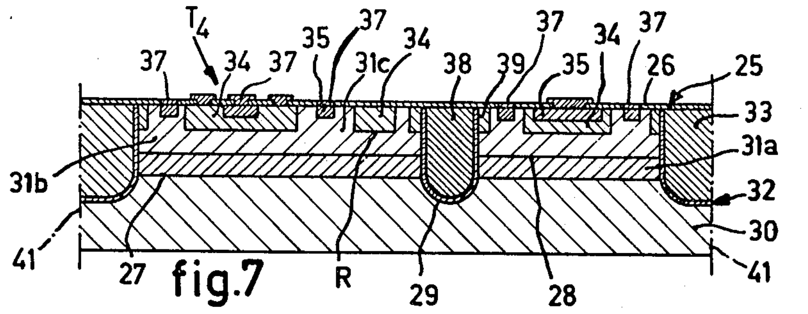
FIGURE 7 is a sectional view of the same integrated circuit, taken on the line VII—VII of FIGURE 6.

FIGURES 6 and 7 are a plan view and a sectional view respectively, of the circuit of FIGURE 5 integrated in accordance with the invention. Dot-and-dash lines 41 indicate the area at which the circuit after completion can be cut from a larger plate.

The various circuit elements are divided over three relatively insulated islands. Thick lines in FIGURE 6 indicate the boundaries of these islands, one of which corresponds to diode D, a second of which corresponds to transistor T5 and the third of which combines the resistor R and the transistors T3 and T4. This plan view again shows the contact areas corresponding to the terminals *e*, *f*, *g*, *h* and *i*. These contact areas are parts of conducting tracks, inter alia the track 36. The said tracks with their contact areas in the form of widenings are shown cross-hatched for the sake of clarity.

The sectional view of FIGURE 7 shows a substrate 30 and a first epitaxial layer 31*a* having a conductivity type opposite to that of the substrate and having a low resistivity, which layer is referred to as "buried layer" and is specially intended to decrease the series-resistance of the collectors of the transistors. 31*b* indicates a second epitaxial layer of a conductivity type which is likewise opposite to that of the substrate.

The regions 34 are portions which have remained of a third layer likewise deposited epitaxially. The conductivity type of these portions is opposite to that of the layer 31*b*. The regions 31*c* are diffused regions of a conductivity type equal to that of the layer 31 and extend throughout the thickness of the upper epitaxial layer, so that the said portions 34 remain which form the bases of the transistors T3, T4 and T5, the resistor R and a region of the diode D.

The regions 35 are diffused regions of a conductivity type opopsite to that of the islands 34 and of a low resistivity, which form the emitters of the transistors and the contact areas of the collectors of the same transistors.

The substrate 30 is of monocrystaline p-type silicon, the layer 31*a* is an n-type layer, the layer 31*b* is an n-type layer, the layer 34 is a p-type layer and the diffused regions 35 are $n^+$-type zones; the transistors are of the npn-type.

The islands are separated by grooves 29 each coated with an insulating silicon oxide layer 39 and filled with polycrystalline silicon 38.

FIGURE 7 shows in section the transistor T4, the resistor R and the diode D. The diode D is of a structure identical with that of the transistors and comprises an npn-transistor the collector and the base of which are short-circuited.

The surface 25 is covered with an insulating layer 26 of, for example, silicon oxide, in which windows are formed for electrical connection to semiconductor regions and on which inter alia conductive tracks 36 or 42 are deposited.

The substrate is a square having sides of 1 mm. each. The thickness of the substrate is 150$\mu$, that of the layers 31*a*, 31*b*, 34 is 5$\mu$, 4$\mu$ and 3$\mu$ respectively. The insulating grooves then have a depth of 20$\mu$ so that they extend into the substrate 30, while the insulating layer is formed by silicon oxide and has a thickness of approximately 1$\mu$. The layer 26 may have the same thickness or may be thicker since it is, at least locally, the resultant of a series of oxidation occurring in the manufacture. The diffused regions 35 have a depth of 2$\mu$ and the conductive tracks with contact areas, which consist of a vapour-deposited aluminium, are at least 0.8$\mu$ thick.

The device of FIGURES 3 and 4 may be manufactured as follows. On a monocrystalline p-type silicon plate 10 (see FIGURES 8*a* to 8*e*), which is approximately 160$\mu$ thick and which must serve as a substrate, a n-type silicon layer 11 is deposited in the usual manner by epitaxy until a thickness of 10$\mu$ is obtained.

The next step consists in forming the grooves 9 (FIGURE 8*b*) which must extend into the substrate 10 and have a depth of approximately 15$\mu$. The grooves are formed by etching in a usual manner, using a photo-resist technique. The grooves separate the islands 11*a*, 11*b*, 11*c* from one another. After forming the grooves, their walls are coated with an insulating layer 12, which in the present example preferably consists of silicon oxide, for which process a conventional technique can be used. Subsequently the grooves are filled with polycrystalline semiconductor material which corresponds to the substrate in thermal respect. In case of a substrate of monocrystalline silicon use is preferably made of polycrystalline silicon.

Figure 8A:
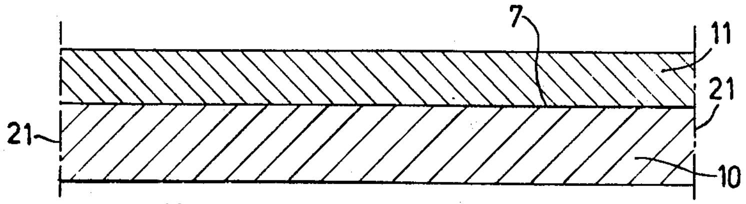
Figure 8B:
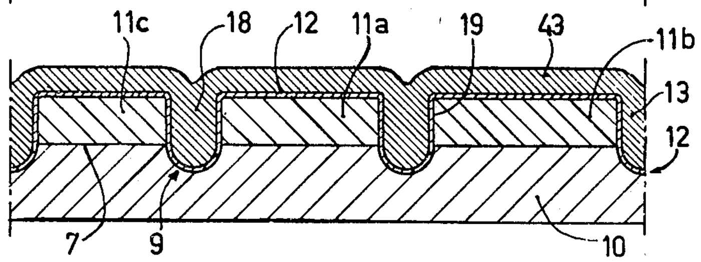

The plate is shown, after the previous processings, in FIGURE 8*b* in which the grooves filled with silicon are indicated by 18 and 13, while the layer 43 has been deposited during the process of filling the grooves. The thickness of this layer may vary according to the process adopted for depositing the silicon and may be approximately 20$\mu$.

The next step consists in removing the layer 43 by a grinding process in order to obtain a flat surface. This grinding process is continued until the surfaces 5 of the islands are exposed. Next a thin layer 44 is applied (FIGURE 8*c*), which will serve as a mask during diffusion processes for obtaining regions of circuit elements. A thin silicon-oxide layer 44 is preferably applied by oxidation, this layer being, for example, 0.4$\mu$ thick.

Figure 8C:
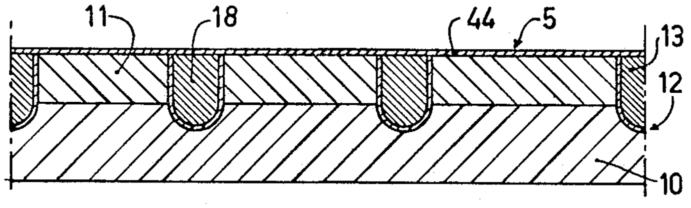

After the layer 44 has been applied, the plate is as shown in FIGURE 8*c*.

The following steps are carried out in order to form regions of active and passive circuit elements in the plate. The resistors will be obtained by local diffusion of p-type impurities, as will be the bases of the transistors.

Figure 8D:
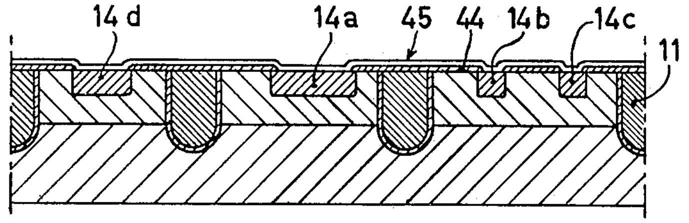
Figure 8E:
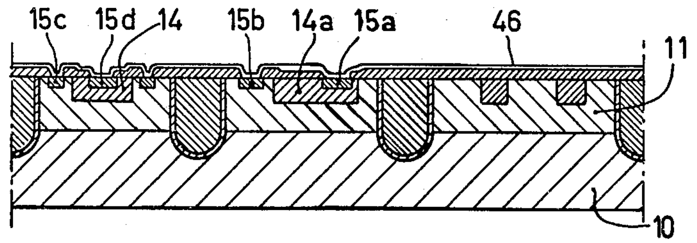

The regions 14 are obtained in the usual manner by diffusion of boron through windows formed in the layer 44 (see FIGURE 8*d*). The regions 14 are approximately 3$\mu$ thick. During the boron diffusion a new oxide layer 45 of approximately 0.4$\mu$ thickness is formed. The regions 14*d* and 14*c* belong to the resistors R1 and R2 shown in plan view in FIGURE 3, the region 14*a* is the base region of transistor T2 and the region 14*d* is the base region of the transistor from which the diode D2 is built up. Subsequently the n-type emitters of the transistors and the n-type contact regions of the collectors are formed in the usual manner by diffusing phosphorus approximately up to a depth of 2$\mu$, whereby a new silicon oxide layer of approximately 0.3$\mu$ thickness is formed. The result is shown in FIGURE 8*e*. The region 15*a* is the emitter of transistor T2, the region 15*b* is the contact region of the collector of the same transistor, the region 15*d* is the emitter of the transistor from which the diode D2 is built up, and the region 15*c* is a contact region of the collector of the latter transistor. Next the conductive tracks with their contact areas *a* to *d* shown cross-hatched in FIGURE 3 are formed. The tracks and the contact areas consist of aluminium.

After all these processings the plate corresponds to FIGURE 4, in which the oxide layer 6 is shown of uniform thickness for the sake of clarity, while the proportions of the dimensions in the various figures have been neglected.

The various circuits manufactured on a plate are separated from one another along the lines 21.

The semiconductor device shown in FIGURES 6 and 7 can be manufactured in a similar manner. Starting from a monocrystalline p-type silicon plate having a thickness of approximately 150$\mu$ there is first formed a $n^+$-type epitaxial (layer 31*a* of FIGURE 7), which layer will serve as a buried layer of the collectors of the transistors, then a second n-type epitaxial layer, which constitutes the collectors (layer 31*b*), and then a third epitaxial p-type layer to which the portions 34 belong.

After these depositions the insulating grooves are formed, which are covered with an insulating layer and then filled, followed by a grinding process and an oxidising process, all these processings being carried out in a similar manner as in the previous example.

Via windows in the said layer n-type impurities are diffused into the epitaxial layer 31*b*, such that only the parts 34 remain p-type, which portions 34 form the resistor R and the bases of the transistors.

A second diffusion is then carried out in a similar manner as in the previous example for forming the emitters of the transistors and the contact regions of the collectors, whereupon the conductive tracks with their contact areas *j* to *i* are formed.

It will be evident that the present invention is not confined to substrates of silicon, to insulation by an $SiO_2$-layer and to the filling of the insulating grooves by polycrystalline silicon. The invention also relates to other semiconductors, for example, gallium-arsenide, germanium and so on, and to other insulating layers, for example nitrides.

What is claimed is:

1. An integrated semiconductor device comprising a monocrystalline substrate portion of semiconductive material of one type conductivity having on a surface thereof an epitaxial layer of semiconductive material of the opposite type conductivity forming an insulating p-n junction with the substrate, said epitaxial layer being a crystallographic extension of the substrate, a plurality of insulating, polycrystalline semiconductive material filled grooves in said epitaxial layer and extending from the surface of the latter across the p-n junction and into the substrate portion forming plural islands in said epitaxial layer insulated from neighboring islands in part by the p-n junction between the epitaxial layer and the substrate and for the remainder by the filled grooves, the filled grooves and the epitaxial layer having surfaces extending in substantially the same plane, an insulating layer on the surface of the filled grooves and the epitaxial layer, plural semiconductor circuit elements formed in the plural islands with at least one circuit element in each of at least two of the islands, said insulating layer having openings over at least said two islands, and conductive tracks on the insulating layer and extending through the openings therein into electrical contact with at least the circuit elements in the said two islands interconnecting them together.

2. An integrated semiconductor device as set forth in claim 7 wherein the epitaxial layer is of the same semiconductive material as that of the substrate.

3. An integrated semiconductor device as set forth in claim 8 wherein the polycrystalline semiconductive material is the same as that of the substrate.

4. An integrated semiconductor device as set forth in claim 8 wherein an insulating layer is provided between the groove walls and the polycrystalline semiconductive material.

5. An integrated semiconductor device as set forth in claim 4 wherein the polycrystalline material is of silicon and the insulating layer on the groove walls is silicon oxide.

6. An integrated semiconductor device as set forth in claim 1 wherein at least some of the conductive tracks have widened portions serving as contact areas, said widened contact areas lying wholly over the filled grooves and spaced from the islands, and means providing a connection to the widened contact areas.

References Cited

UNITED STATES PATENTS

| | | | |
|---|---|---|---|
| 3,271,685 | 9/1966 | Husher et al. | 325—440 |
| 3,370,995 | 2/1968 | Lowery et al. | 148—175 |
| 3,400,309 | 9/1968 | Doo | 317—234 |

JOHN W. HUCKERT, Primary Examiner

SIMON BRODER, Assistant Examiner

U.S. Cl. X.R.

148—175; 317—234